US011259428B2

(12) United States Patent
Kang et al.

(10) Patent No.: US 11,259,428 B2
(45) Date of Patent: Feb. 22, 2022

(54) FOLDABLE ELECTRONIC DEVICE AND HINGE STRUCTURE THEREOF

(71) Applicant: Samsung Electronics Co., Ltd., Gyeonggi-do (KR)

(72) Inventors: Hyosung Kang, Gyeonggi-do (KR); Yongwoon Kim, Gyeonggi-do (KR); Myeongsil Park, Gyeonggi-do (KR); Kwangho Shin, Gyeonggi-do (KR); Sangyup Lee, Gyeonggi-do (KR); Jinwan An, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/889,964

(22) Filed: Jun. 2, 2020

(65) Prior Publication Data
US 2020/0383220 A1 Dec. 3, 2020

(30) Foreign Application Priority Data

Jun. 3, 2019 (KR) .................. 10-2019-0065343

(51) Int. Cl.
*F16C 11/00* (2006.01)
*H05K 5/02* (2006.01)
*F16C 11/04* (2006.01)
*H05K 5/00* (2006.01)

(52) U.S. Cl.
CPC ............ *H05K 5/0226* (2013.01); *F16C 11/04* (2013.01); *H05K 5/0017* (2013.01)

(58) Field of Classification Search
None
See application file for complete search history.

(56) References Cited

U.S. PATENT DOCUMENTS

| 9,342,101 | B2 * | 5/2016 | Hsu .................. G06F 1/1679 |
| 9,541,962 | B2 | 1/2017 | Siddiqui |
| 9,677,308 | B1 * | 6/2017 | Chen ................. G06F 1/1681 |
| 10,480,227 | B1 * | 11/2019 | Chen .................. E05D 3/122 |
| 10,775,852 | B2 | 9/2020 | Kim et al. |

(Continued)

FOREIGN PATENT DOCUMENTS

| KR | 10-1237952 B1 | 2/2013 |
| KR | 10-1296335 B1 | 8/2013 |

(Continued)

OTHER PUBLICATIONS

International Search Report dated Sep. 18, 2020.

*Primary Examiner* — Anthony Q Edwards
*Assistant Examiner* — Rashen E Morrison
(74) *Attorney, Agent, or Firm* — Cha & Reiter, LLC

(57) ABSTRACT

One or more embodiments relate to a foldable electronic device. The electronic device includes a display, a foldable housing including a first housing structure and a second housing structure, and a hinge structure disposed between the first housing structure and the second housing structure. The hinge structure may include a first structure configured to enable the first housing structure to rotate about a first folding axis and the second housing structure to rotate about a second folding axis, and a second structure configured to fix the first housing structure and the second housing structure in an unfolded state or a folded state. Other various embodiments are possible.

20 Claims, 11 Drawing Sheets

(56) References Cited

U.S. PATENT DOCUMENTS

| | | | |
|---|---|---|---|
| 10,963,020 B2 * | 3/2021 | Kim | G06F 1/1616 |
| 10,983,569 B2 * | 4/2021 | Lin | G06F 1/1616 |
| 2011/0205695 A1 | 8/2011 | Hassemer et al. | |
| 2013/0016492 A1 | 1/2013 | Wang et al. | |
| 2016/0011632 A1 * | 1/2016 | Hsu | H04M 1/022 16/354 |
| 2018/0166842 A1 * | 6/2018 | Siddiqui | G06F 1/1681 |
| 2019/0166703 A1 * | 5/2019 | Kim | G06F 1/1681 |
| 2019/0369668 A1 * | 12/2019 | Kim | G06F 1/1681 |

FOREIGN PATENT DOCUMENTS

| | | |
|---|---|---|
| KR | 10-2015-0099383 A | 8/2015 |
| KR | 10-1574534 B1 | 12/2015 |
| KR | 10-2017-0033626 A | 3/2017 |
| KR | 10-2017-0077096 A | 7/2017 |
| KR | 10-1814067 B1 | 1/2018 |

* cited by examiner

FOLDABLE ELECTRONIC DEVICE AND HINGE STRUCTURE THEREOF

CROSS-REFERENCE TO RELATED APPLICATION(S)

This application is based on and claims priority under 35 U.S.C. 119 to Korean Patent Application No. 10-2019-0065343, filed on Jun. 3, 2019, in the Korean Intellectual Property Office, the disclosure of which is herein incorporated by reference in its entirety.

BACKGROUND

1) Field

Certain embodiments disclosed herein generally relate to a foldable electronic device and a hinge structure thereof.

2) Description of Related Art

Recently, as display-related technologies have developed, electronic devices incorporating flexible displays have also been developed. A flexible display can be used when flat and can also be deformed and be used in various specific shapes. For example, electronic devices including a flexible display may be foldable so as to be folded or unfolded about at least one folding axis.

The above information is presented as background information only to assist with an understanding of the disclosure. No determination has been made, and no assertion is made, as to whether any of the above might be applicable as prior art with regard to the disclosure.

SUMMARY

A foldable electronic device may include a gear hinge for folding or unfolding a first housing and a second housing. Tolerances and other structural characteristics of the gear hinge may allow the first housing and the second housing to be shaken while being folded or unfolded, or in the folded state or the unfolded state. Accordingly, such a foldable electronic device needs a device that can fix the first housing and the second housing while they are in specific states such as the folded state or the unfolded state. For example, the foldable electronic device may be configured such that magnets are disposed at sides of the first housing and the second housing to face each other in the folded state or the unfolded state. As such, the first housing and the second housing can be fixed by the attraction force between the facing magnets.

However, magnets may influence the operations of electromagnetic resonance (EMR) type devices of the electronic device (e.g., electronic or digitizer pen accessories of the electronic device). For example, the magnets may cause an error related to operations between the electronic pen and the electronic device.

A flexible electronic device according to an embodiment, for example, includes: a display; a foldable housing including a first housing structure and a second housing structure; and a hinge structure disposed between the first housing structure and the second housing structure, in which the hinge structure may include: a first structure configured to enable the first housing structure to rotate about a first folding axis and the second housing structure to rotate about a second folding axis; and a second structure configured to fix the first housing structure and the second housing structure in an unfolded state or a folded state.

A hinge structure included in a foldable electronic device according to an embodiment may include: a gear structure configured to enable a first housing structure connected to a side of the hinge structure to rotate about a first folding axis and a second housing structure connected to another side of the hinge structure to rotate about a second folding axis; and a cam structure configured to fix the first housing structure and the second housing structure in an unfolded state or a folded state.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
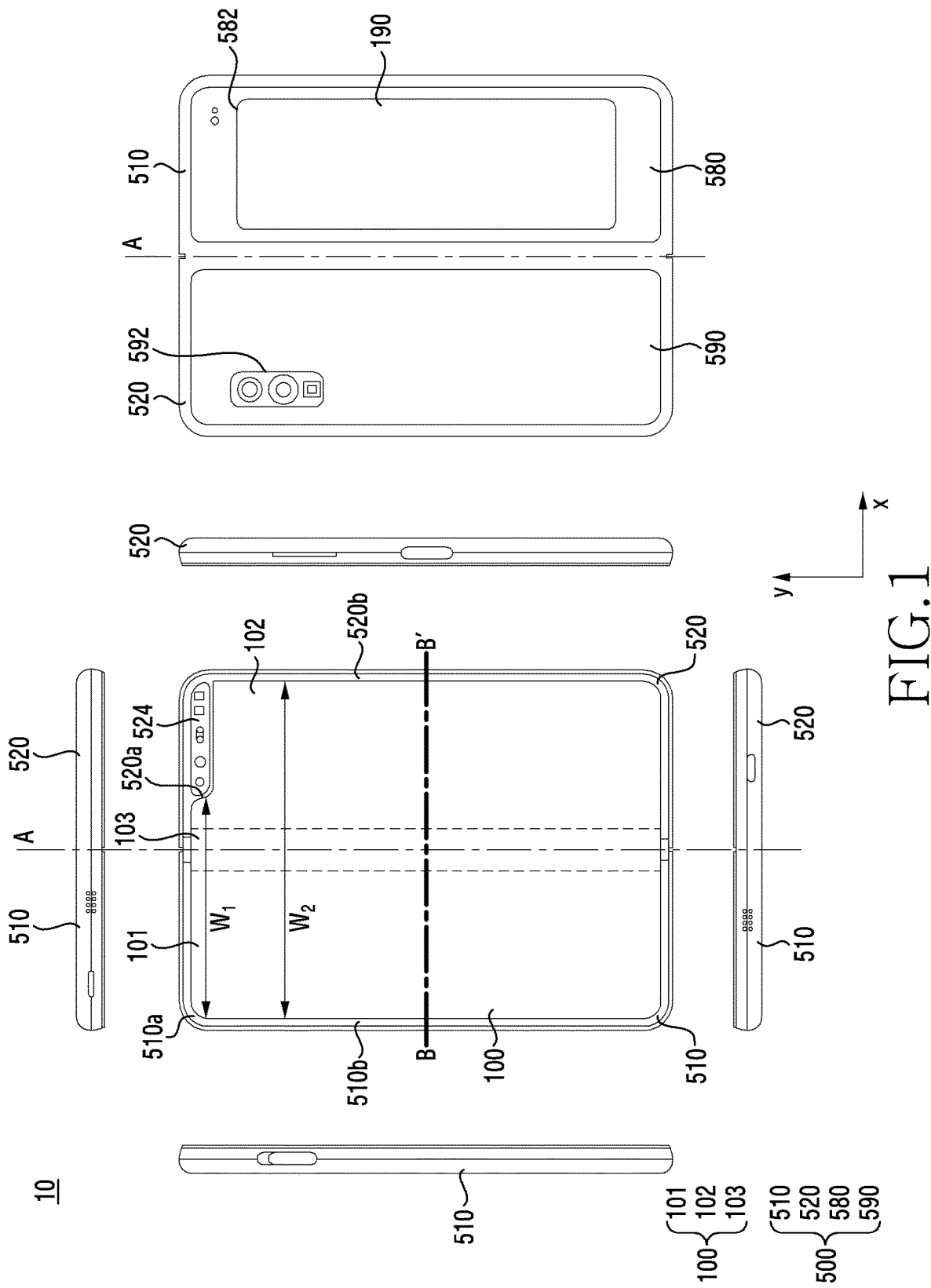
FIG. 1 is a view showing an unfolded state of an electronic device according to an embodiment.

Hereinafter, various embodiments will be described with reference to the accompanying drawings. Although this document has specific embodiments illustrated in the drawings and described in detail with reference thereto, the same is not for the purpose of limiting various embodiments to specific forms. For example, it would be obvious to a person skilled in the art to which the disclosure pertains that various embodiments can be variously modified.

Certain embodiments disclosed herein may provide a hinge structure that can fix a foldable display device in specific states (e.g., folded state, unfolded state, intermediate state, etc.) without using magnets.

Certain embodiments disclosed herein can fix a foldable electronic device in specific states by applying a cam structure to a gear hinge.

The objectives to implement in the disclosure are not limited to the technical problems described above and other objectives that are not stated herein will be clearly understood by those skilled in the art from the following specifications.

Figure 2:
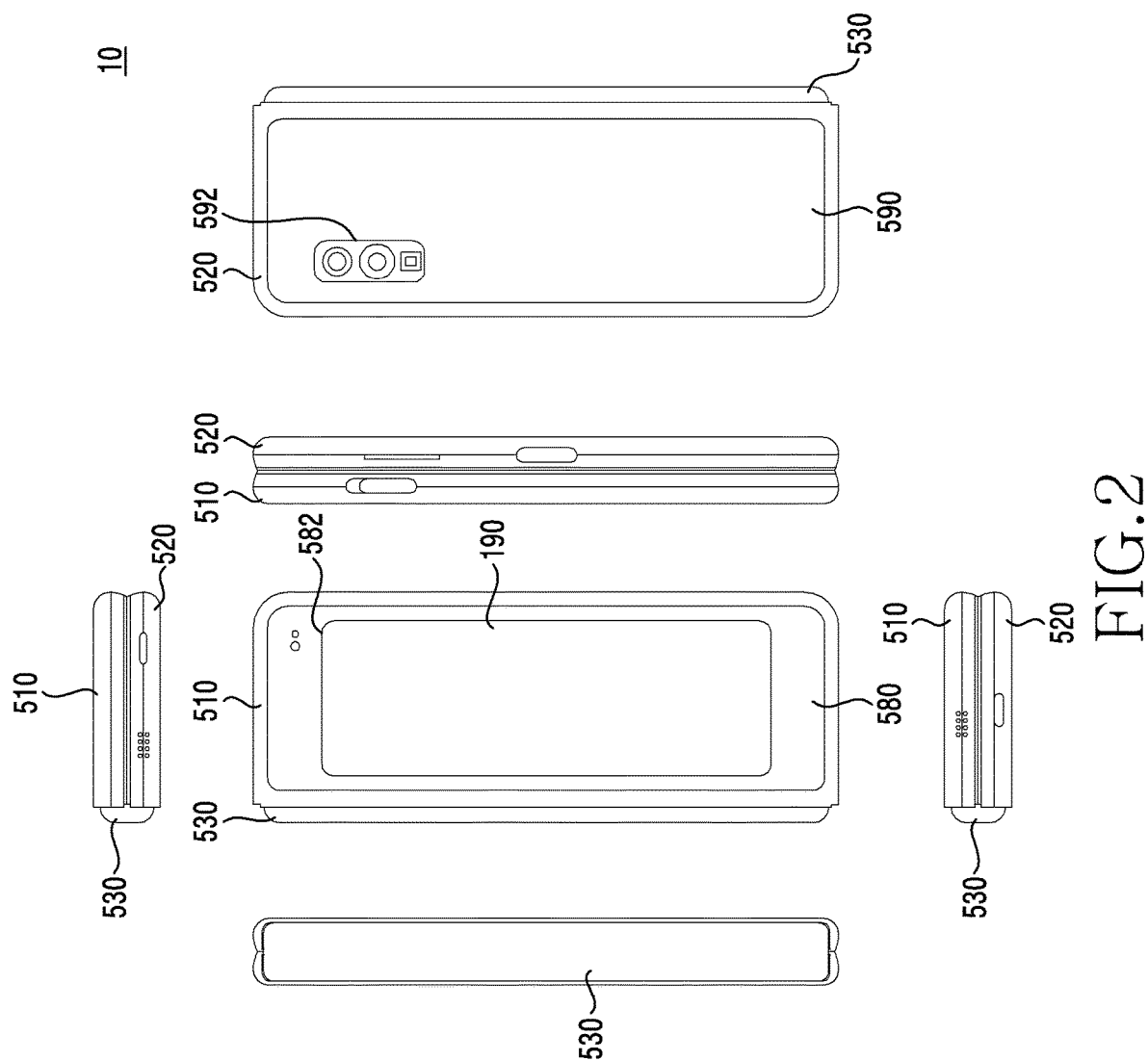
FIG. 2 is a view showing a folded state of the electronic device according to an embodiment.

FIG. 1 is a view showing an unfolded state of an electronic device according to an embodiment and FIG. 2 is a view showing a folded state of the electronic device according to an embodiment.

Referring to FIGS. 1 and 2, in an embodiment, an electronic device 10 may include: a foldable housing 500; a hinge cover 530 covering a foldable portion of the foldable housing 500; and a flexible or foldable display 100 (or abbreviated as "display 100") disposed in a space defined by the foldable housing 500. In this specification, the surface on which the display is disposed is referred to as a first surface or the front surface of the electronic device 10. The opposite surface to the front surface is referred to as a second surface of the rear surface of the electronic device 10. The surface surrounding the space between the front surface and the rear surface is referred to as a third surface or the side of the electronic device 10.

In an embodiment, the foldable housing 500 may include a first housing structure 510, a second housing structure 520 having a sensor section 524, a first rear surface cover 580, and a second rear surface cover 590. The embodiment shown in FIGS. 1 and 2 is only an example, and the foldable housing 500 of the electronic device 10 is not limited to the shown embodiment. In other embodiments, the foldable housing 500 may be implemented with different parts or components. For example, in another embodiment, the first housing structure 510 and the first rear surface cover 580 may be integrally formed, and the second housing structure 520 and the second rear surface cover 590 may be integrally formed.

According to an embodiment, the first housing structure 510 and the second housing structure 520 are disposed at both sides with a folding axis (axis A) therebetween, and the foldable housing 500 is symmetric with respect to the folding axis (axis A). As described below, the angle or distance between the first housing structure 510 and the second housing structure 520 may be changed in accordance with whether the electronic device 10 is unfolded, folded, or in an intermediate state between the folded state and the unfolded state. In the embodiment shown in the figures, the second housing structure 520, unlike the first housing structure 510, additionally has a sensor section 524 in which various sensors are disposed, but the two housing structures may be otherwise symmetric.

According to an embodiment, as shown in FIG. 1, the first housing structure 510 and the second housing structure 520 may together form a recess for accommodating the display 100. In the embodiment shown in the figures, the recess may have two or more different widths in the direction perpendicular to the folding axis (axis A) due to the sensor section 524.

For example, the recess may have a first width w1 between a first portion 510a that is parallel with the folding axis (axis A) in the first housing structure 510 and a first portion 520a formed at an edge of the sensor section 524 of the second housing structure 520 that is closer to the first housing structure 510, and a second width w2 between a second portion 510b of the first housing structure 510 and a second portion 520b in the second housing structure 520 that is outside the sensor section 524 and is parallel with the folding axis (axis A). In this case, the second width w2 may be larger than the first width w1. In other words, the first portion 510a of the first housing structure 510 and the first portion 520a of the second housing structure 520, which are asymmetric with respect to each other, may define the first width w1 of the recess, and the second portion 510b of the first housing structure 510 and the second portion 520b of the second housing structure 520, which are symmetric with respect to each other, may define the second width w2 of the recess. In an embodiment, the first portion 520a and the second portion 520b of the second housing structure 520 may have different distances from the folding axis (axis A). The widths of the recess are not limited to the example shown in the figures. In an embodiment, the recess may have a plurality of widths due to the shape of the sensor section 524 or the asymmetric shape of the first housing structure 510 and the second housing structure 520.

In an embodiment, at least a portion of the first housing structure 510 and the second housing structure 520 may be made of a metallic material or a nonmetallic material that has sufficient rigidity to support the display 100.

In an embodiment, the sensor section 524 may be a predetermined area adjacent to a corner of the second housing structure 520. However, the disposition, shape, and size of the sensor section 524 are not limited to the example shown in the figures. For example, in another embodiment, the sensor section 524 may be provided at another corner of the second housing structure 520 or in a predetermined area between an upper corner and a lower corner. In an embodiment, components for performing various functions of the electronic device 10 may be exposed on the front surface of the electronic device 10 in the sensor section 524 or one or more openings provided in the sensor section 524. In various different embodiments, the components may include various kinds of sensors. The sensors, for example, may include at least one of front camera, receiver, or proximity sensor.

The first rear cover 580 is disposed at a side of the folding axis (axis A) on the rear surface of the electronic device 10 and, for example, may have a substantially rectangular shape, and its periphery may be surrounded by the first housing structure 510. Similarly, the second rear cover 590 is disposed at the other side from the folding axis (axis A) on the rear surface of the electronic device 10 and the periphery thereof may be surrounded by the second housing structure 520.

In the embodiment shown in the figures, the first rear cover 580 and the second rear cover 590 may have be substantially symmetrical with respect to the folding axis (axis A) therebetween. However, the first rear cover 580 and the second rear cover 590 do not necessarily have to have a symmetric shape, and in another embodiment, the electronic device 10 may include a first rear cover 580 and a second rear cover 590 that have different shapes. In another embodiment, the first rear cover 580 may be formed integrally with the first housing structure 510, and the second rear surface cover 590 may be may be formed integrally with the second housing structure 520.

In an embodiment, the first rear cover 580, the second rear cover 590, the first housing structure 510, and the second housing structure 520 may define a space in which various components (e.g., printed circuit board, battery, etc.) of the electronic device 10 can be disposed. In an embodiment, one or more components may be disposed or visually exposed on the rear surface of the electronic device 10. For example, at least a portion of a sub-display 190 may be visually exposed through the first rear surface section 582 of the first rear surface cover 580. In another embodiment, one or more components or sensors may be visually exposed through a second rear surface section 592 of the second rear surface cover 590. In an embodiment, the sensors may include a proximity sensor and/or a rear camera.

Referring to FIG. 2, the hinge cover 530 is disposed between the first housing structure 510 and the second housing structure 520 and may be configured to cover internal components of the electronic device 10 (e.g., a hinge structure). In an embodiment, the hinge cover 530 may be covered by a portion of the first housing structure 510 and the second housing structure 520 or may be exposed to the outside, depending on the states of the electronic device 10 (e.g., the unfolded state (flat state) or the folded state).

For example, as shown in FIG. 1, when the electronic device 10 is in the unfolded state, the hinge cover 530 can be covered by the first housing structure 510 and the second housing structure 520 such that it is not exposed. For example, as shown in FIG. 2, when the electronic device 10 is in the folded state (e.g., the fully folded state), the hinge cover 530 can be exposed to the outside while being between the first housing structure 510 and the second housing structure 520. In another example, in an intermediate status in which first housing structure 510 and the second housing structure 520 are folded at a certain angle (e.g. 90 degrees), the hinge cover 530 can be partially exposed to the outside while being between the first housing structure 510 and the second housing structure 520. However, in this case, the exposed area may be smaller than that while in the fully folded state. In an embodiment, the hinge cover 530 may have a curved surface.

The display 100 may be disposed in a space defined by the foldable housing 500. For example, the display 100 may be seated in the recess formed by the foldable housing 500 and may have a size such that it takes up most of the front surface of the electronic device 10.

Accordingly, the front surface of the electronic device 10 may include the display 100, and a partial area of the first housing structure 510 and a partial area of the second housing structure 520 that are adjacent to the display 100. The rear surface of the electronic device 10 may include the first rear cover 580, a partial area of the first housing structure 510 that is adjacent to the first rear cover 580, the second rear cover 590, and a partial area of the second housing structure 520 that is adjacent to the second rear cover 590.

The display 100 may be a flexible display of which at least a partial area can be deformed into a flat surface or a curved surface. In an embodiment, the display 100 may have a folding section 103, a first section 101 disposed at a side from the folding section 103 (at the left side of the folding section 103 shown in FIG. 1), and a second section 102 disposed at another side (at the right side of the folding section 103 shown in FIG. 1).

The divided sections of the display 100 shown in FIG. 1 are only examples and the display 100 may be divided into a plurality of other sections (e.g., four or more or two sections), depending on the structure or the function. For example, the sections of the display 100 can be divided by the folding section 103 or the folding axis (axis A) extending in parallel with the y-axis in the embodiment shown in FIG. 1. But in another embodiment, the display 100 may be divided into sections by another folding section (e.g., a folding section parallel with eh x-axis) or another folding axis (e.g., a folding axis parallel with the x-axis).

The first section 101 and the second section 102 may be entirely symmetric with respect to the folding section 103 therebetween. However, the second section 102, unlike the first section 101, may have a cut notch, depending on existence of the sensor section 524, but may be otherwise symmetric to the first section 101. In other words, the first section 101 and the second section 102 may have a portion where they are symmetric to each other and a portion where they are asymmetric to each other.

Hereafter, the operation of the first housing structure 510 and the second housing structure 520 according to the states of the electronic device 10 (e.g., the unfolded state (flat state) and the folded state), and the sections of the display 100 are described.

In an embodiment, when the electronic device 10 is in the unfolded state (flat state) (e.g., FIG. 1), the first housing structure 510 and the second housing structure 520 may be arranged in the same direction while making an angle of 180 degrees. The surface of the first section 101 and the surface of the second section 102 of the display 100 may make an angle of 180 degrees and may be arranged to face the same direction (e.g., toward the front of the electronic device). The folding section 103 may be flat and form the same plane as the first section 101 and the second section 102.

In an embodiment, when the electronic device 10 is in the folded state (e.g., FIG. 2), the first housing structure 510 and the second housing structure 520 may be arranged to face each other. The surface of the first section 101 and the surface of the second section 102 of the display 100 may face each other while making a small angle (e.g., between 0 to 10 degrees). The folding section 103 may be at least partially a curved surface having a predetermined curvature.

In an embodiment, when the electronic device 10 is in the intermediate state, the first housing structure 510 and the second housing structure 520 may be arranged with a certain angle therebetween. The surface of the first section 101 and the surface of the second section 102 of the display 100 may make an angle larger than that in the folded state (e.g. FIG. 2) and smaller than that in the unfolded state (e.g., FIG. 1). The folding section 103 may be at least partially a curved surface having a predetermined curvature, in which the curvature may be smaller than that in the folded state.

Meanwhile, for the convenience of description, FIGS. 1 and 2 show one folding axis (axis A). However, the instant disclosure is not so limited, and there may be two folding axes (axes A). For example, the folding axis (axis A) may include a first folding axis (e.g., A1 in FIG. 4) for rotation of the first housing structure 510 and a second folding axis (e.g., A2 in FIG. 4) for rotation of the second housing structure 520.

Figure 3:
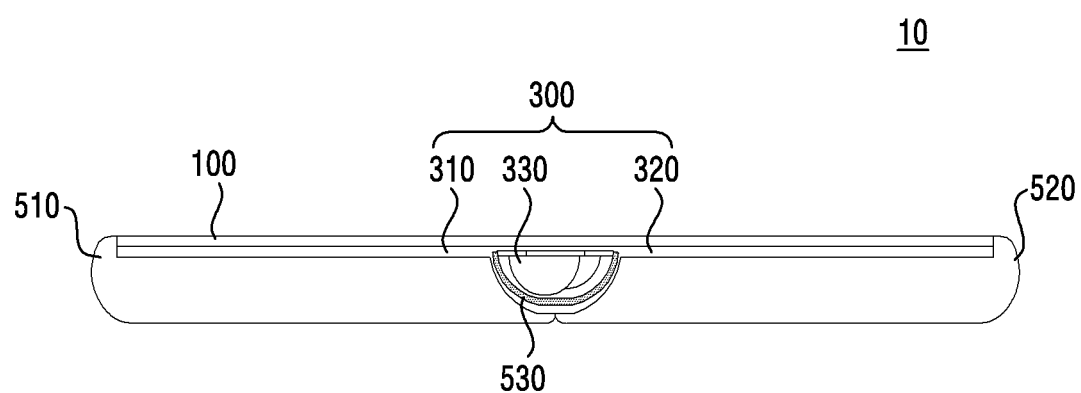
FIG. 3 is a cross-sectional view taken along line B-B' of FIG. 1.
Figure 4:
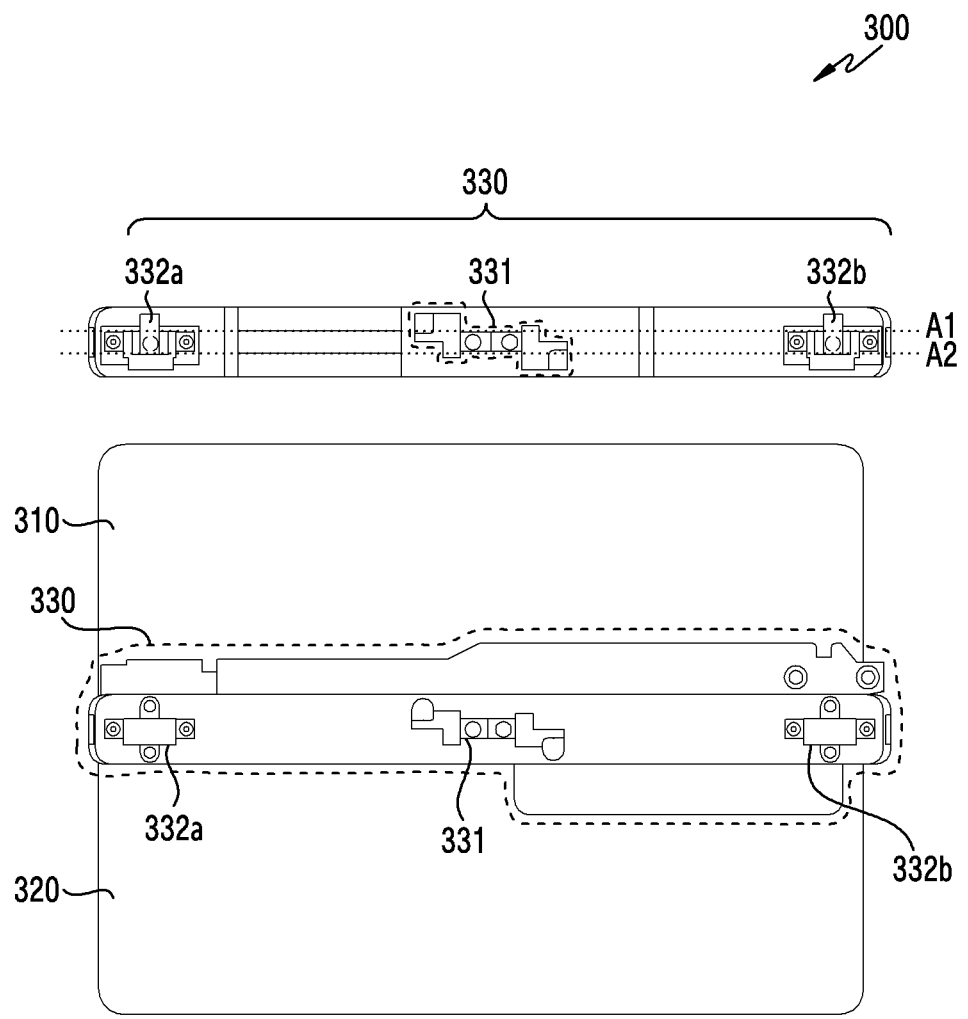
FIG. 4 is a view showing a bracket assembly of the electronic device according to an embodiment.

FIG. 3 is a cross-sectional view taken along line B-B' of FIG. 1 and FIG. 4 is a view showing a bracket assembly of the electronic device according to an embodiment.

Referring to FIGS. 3 and 4, in the electronic device 10 according to an embodiment of the disclosure, a bracket assembly 300 may be disposed between the display 100 and the second surface of the foldable housing 500. For example, the bracket assembly 300 may support the display 100 and may be covered by the first housing structure 510, the second housing structure 520, and the hinge cover 530.

The bracket assembly 300 may include a first bracket 310, a second bracket 320, and a hinge structure 330 disposed between the first bracket 310 and the second bracket 320.

The first bracket 310 can support at least a portion of a first section (e.g., the first section 101) of the display and the second bracket 320 can support at least a portion of a second section (e.g., the second section 102) of the display 100. The first bracket 310 and the second bracket 320 may be at least partially made of a metallic material (e.g., stainless steel).

The hinge structure 330 rotates about the folding axis of the first bracket 310 and the second bracket 320 and can be fixed in specific states (e.g., the unfolded state, the folded state, or the intermediate state) (e.g., fixed when an external force of a predetermined magnitude or less is applied). For example, the hinge structure 330 may include a first structure that enables the first bracket 310 to rotate about a first folding axis (A1 in FIG. 4) and the second bracket 320 to rotate about a second folding axis (A2 in FIG. 4), and a second structure that fixes the first bracket 310 and/or the second bracket 320 in specific states.

The hinge structure 330 may include a main hinge 331, a first side hinge 332a, and a second side hinge 332b.

The main hinge 331 is disposed at the center of a folding section (e.g., the folding section 103) of the electronic device 10 and can perform the main function of the hinge structure 330. For example, the main hinge 331 can enable the first bracket 310 to rotate about the first folding axis A1 and the second bracket 320 to rotate about the second folding axis A2 and can fix the first bracket 310 and the second bracket 320 in specific states (e.g., the unfolded state, the folded state, or the intermediate state). The details of the structure of the main hinge 331 will be described with reference to FIG. 5.

The first side hinge 332a and the second side hinge 332b are positioned at the two ends of the folding section (e.g., the folding section 103) and can hold the first bracket 310 and the second bracket 320 in place so that they do not shake when folding or unfolding. For example, the first side hinge 332a and the second side hinge 332b may be positioned at both ends of the hinge structure 330 and can prevent the first housing structure 510 and the second housing structure 520 from shaking at both ends.

According to an embodiment, the electronic device 10 may further include an electro magnetic resonance type electronic pen (or stylus pen). The display 100 may further include an electro magnetic resonance type touch panel that senses input from the electronic pen. Because the electronic device 10 does not include magnets, errors are not generated when the electronic device is recognizing the electronic pen. The display 100 may further include an electrostatic type touch panel that senses pressure of touches by a user (e.g., finger touch) and/or a pressure panel that senses pressure.

Figure 5:
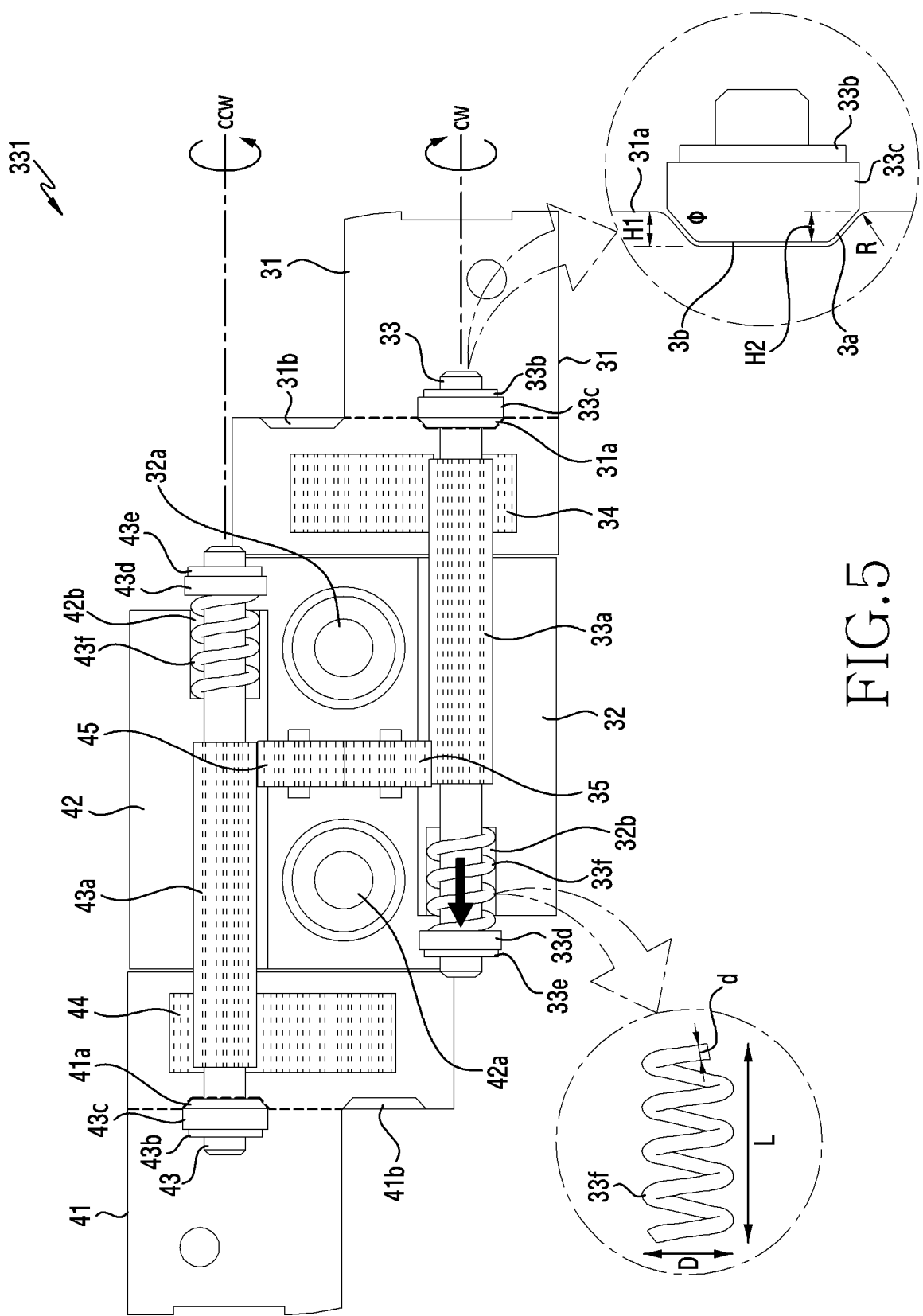
FIG. 5 is a view schematically showing a main hinge of the bracket assembly according to an embodiment.

FIG. 5 is a view showing a main hinge of the bracket assembly of the electronic device according to an embodiment.

Referring to FIG. 5, the main hinge 331 may include a first bracket housing 31, a first fixing bracket 32, a first folding shaft 33, a first internal gear 34, a first gear 35 (e.g., a toothed spur gear), a second bracket housing 41, a second fixing bracket 42, a second folding shaft 43, a second internal gear 44, and a second gear 45 (e.g., a toothed spur gear). The first folding shaft 33 may be combined with a first main gear 33a, a first housing ring 33b, a first housing cam 33c, first gear rings 33d and 33e, and a first elastic member 33f. The first main gear 33a and/or the first housing cam 33c may be integrally formed with the first folding shaft 33. The second folding shaft 43 may be combined with a second main gear 43a, a second housing ring 43b, a second housing cam 43c, second gear rings 43d and 43e, and a second elastic member 43f. The second main gear 43a and/or the second housing cam 43c may be integrally formed with the second folding shaft 43.

The first bracket housing 31 may include a first unfolding cam 31a and a first folding cam 31b. Similarly, the second bracket housing 41 may include a second unfolding cam 41a and a second folding cam 41b.

The first fixing bracket 32 and the second fixing bracket 42 may be fixed to the hinge cover 530. For example, the first fixing bracket 32 and the second fixing bracket 42 may be fixed to the hinge cover 530 by bolts inserted in a first groove 32a and a second groove 42a. The first fixing bracket 32 and the second fixing bracket 42 are not limited thereto and may be fixed to the hinge cover 530 by various types of fasteners.

The first bracket housing 31 may be rotatably combined with the first fixing bracket 32. For example, the first bracket housing 31 and the first fixing bracket 32 may be combined to be rotatable clockwise (CW) or counterclockwise (CCW) by the first folding shaft 33 disposed through (or penetrated) the first bracket housing 31 and the first fixing bracket 32. Similarly, the second bracket housing 41 and the second fixing bracket 42 may be combined to be rotatable clockwise (CW) or counterclockwise (CCW) by the second folding shaft 43 disposed through the second bracket housing 41 and the second fixing bracket 42.

The first bracket housing 31 may have a first unfolding cam 31a and a first folding cam 31b on the outer surface thereof. The first unfolding cam 31a and the first folding cam 31b may be recesses in which the first housing cam 33c of the first folding shaft 33 is inserted. Similarly, the second bracket housing 41 may have a second unfolding cam 41a and a second folding cam 41b on the outer surface. The second unfolding cam 41a and the second folding cam 41b may be recesses in which the second housing cam 43c of the second folding shaft 43 is inserted.

The first folding shaft 33 can connect the first bracket housing 31 and the first fixing bracket 32 such that they can rotate. For example, the first folding shaft 33 can connect the first bracket housing 31 and the first fixing bracket 32 such that the first bracket housing 31 rotates clockwise (CW) or counterclockwise (CCW) about the first fixing bracket 32 fixed to the hinge cover 530.

The first main gear 33a may be fitted on the center portion of the first folding shaft 33, the first housing cam 33c and the first housing ring 33b may be fitted on an end portion (e.g., the right side in FIG. 5) of the first folding shaft 33, and the first gear rings 33d and 33e preventing separation of the first elastic member 33f may be fitted on the other end portion (e.g., the left side in FIG. 5) of the first folding shaft 33. The first gear rings 33d and 33e may include an E-ring 33d and a washer ring 33e.

The first housing cam 33c is inserted in the first unfolding cam 31a or the first folding cam 31b of the first bracket housing 31, depending on whether the electronic device 10 is folded or unfolded, thereby being able to prevent movement of the first bracket housing 31 while the electronic device 10 is in specific states (e.g., the unfolded state or the folded state). The first housing cam 33c can be seated in the first unfolding cam 31a or the first folding cam 31b by a reacting force of the first elastic member 33F (show in FIG. 5 as a leftward force), and can be separated out of the first unfolding cam 31a or the first folding cam 31b when a force over a predetermined magnitude is applied (e.g. a force applied by the user to fold or unfold the electronic device 10).

The first housing cam 33c, as shown in FIG. 5, may have a U-shape. For example, the first housing cam 33c may have generally a cylindrical shape and a side portion 3a thereof may have a predetermined angle Ø (e.g., 120 degrees) with respect to the bottom 3b. The height H2 of the side portion 3a may be similar (i.e. correspond) to the depth H1 of the first unfolding cam 31a.

The first unfolding cam 31a may be a groove corresponding to the shape of the first housing cam 33c and having the depth H1. Both ends of the first unfolding cam 31a may have a predetermined curvature (e.g., R(radius): 0.5 cm). This is for smooth separation (or insertion) of the first housing cam 33c out of (or into) the first unfolding cam 31a. The first folding cam 31b may be the same as or similar to the first unfolding cam 31a except for the position where is it disposed.

The first elastic member 33f may be disposed between the first gear rings 33d and 33e and an internal grove 32b of the first fixing bracket 32. The first elastic member 33f can generate a reacting force when being compressed or stretched. For example, the first elastic member 33f can provide a reacting force in a direction opposite to the first housing cam 33c (e.g., the left direction in FIG. 5). By employing the reacting force, the first housing cam 33c can be brought in close contact with the first bracket housing 31 and the first bracket housing 31 can be brought in close contact with the first fixing bracket 32. The reacting force may depend on the length L, the wire diameter d, the outer diameter D, and the material of the first elastic member 33f. The first elastic member 33f may have predetermined strength (e.g., 500 gf) or more to secure adequate reacting or coupling force. For example, the first elastic member 33f may be a spring.

The second elastic member 43f, similar to the first elastic member 33f, may be disposed between the second gear rings 43d and 43e and an internal groove 42b of the second fixing bracket 42 and can provide a reacting force in a direction opposite to the second housing cam 43c (e.g., the right direction in FIG. 5). The second elastic member 43f operates similar to the first elastic member 33f, so it is not described in detail to avoid duplicative disclosure.

The second folding shaft 43, similar to the first folding shaft 33, may be combined with the second main gear 43a, the second housing ring 43b, the second housing cam 43c, second gear rings 43d and 43e, and the second elastic member 43f, and can connect the second bracket housing 41 and the second fixing bracket 42 such that they can rotate. The second folding shaft 43 is similar to the first folding shaft 33, so it is not described in detail to avoid duplicative disclosure.

The first internal gear 34 may be disposed (or formed) on the inner surface of the first bracket housing 31. The first internal gear 34 is engaged with the first main gear 33a on the first folding shaft 33 and can rotate the first bracket housing 31 in correspondence to rotation of the first main gear 33a. For example, the first internal gear 34 can rotate the first bracket housing 31 clockwise (CW) or counter-clockwise (CCW) in correspondence to rotation of the first main gear 33a until the unfolded state changes to the folded state or the folded state changes to the unfolded state.

The second internal gear 44 may be disposed (or formed) on the inner surface of the second bracket housing 41. The second internal gear 44 is engaged with the second main gear 43a on the second folding shaft 43 and can rotate the second bracket housing 41 in correspondence to rotation of the second main gear 43a. For example, the second internal gear 44 can rotate the second bracket housing 41 clockwise (CW) or counterclockwise (CCW) in correspondence to rotation of the second main gear 43a until the unfolded state changes to the folded state or the folded state changes to the unfolded state.

The first gear 35 and the second gear 45 may be disposed close to the center of the main hinge 331. The first gear 35 and the second gear 45 may be toothed spur gears rotating in mesh with each other.

The first gear 35 is engaged with the first main gear 33a on the first folding shaft 33 and can rotate in correspondence to rotation of the first main gear 33a. The rotation of the first gear 35 can rotate the second gear 45, the rotation of the second gear 45 can rotate the second main gear 43a, and the rotation of the second main gear 43a can rotate the second internal gear 44. As described above, when the electronic device 10 is folded or unfolded, the first bracket 310 and the second bracket 320 can be rotated.

The first unfolding cam 31a, the first folding cam 31b, and the first housing cam 33c are not limited to the shapes shown in FIG. 5 and may have various other shapes. For example, the first unfolding cam 31a, the first folding cam 31b, and the first housing cam 33c may be formed in a V-shape or a semicircular shape. According to an embodiment, the first unfolding cam 31a, the first folding cam 31b, and the first housing cam 33c do not need to be in the same shape. For example, the first unfolding cam 31a and the first folding cam 31b may have a rectangular shape and the first housing cam 33c may have a U-shape or round shape. Alternatively, the first unfolding cam 31a and the first folding cam 31b may have a U-shape or a round shape and the first housing cam 33c may have a rectangular shape. Still alternatively, the first unfolding cam 31a may have a U-shape, the first folding cam 31b may have a round shape, and the first housing cam 33c may have a rectangular shape.

Figure 6:
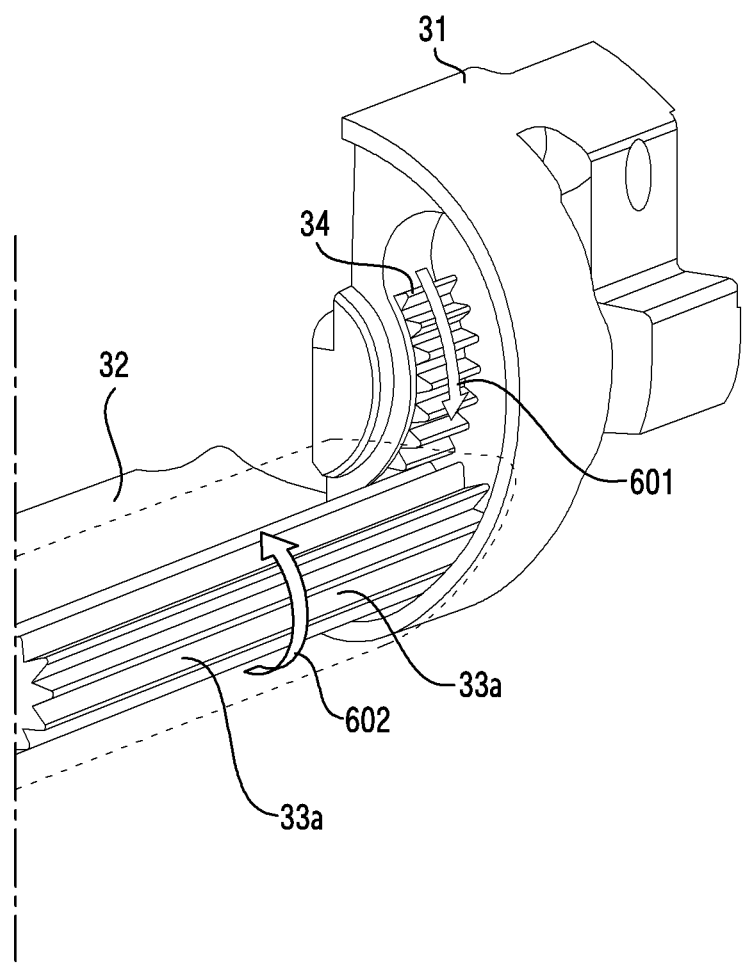
FIG. 6 is a view showing a coupling structure of a first main gear and a first internal gear of the main hinge according to an embodiment.

FIG. 6 is a view showing the operation of the first main gear and the first internal gear of the main hinge according to an embodiment.

Referring to FIG. 6, the first main gear 33a according to an embodiment can operate with the first internal gear 34. For example, when the first internal gear 34 disposed or formed in the first bracket housing 31 is rotated clockwise 601 by an external force applied to the first bracket housing 31 (e.g., a force applied to fold or unfold the first housing structure 510 by a user), the first main gear 33a can rotate counterclockwise 602. On the contrary, when the first internal gear 34 is rotated counterclockwise 602, the first main gear 33a can rotate clockwise 601.

Although FIG. 6 shows only the operation of the first main gear 33a and the first internal gear 34, the second main gear 43a and the second internal gear 44 may operate similarly to the first main gear 33a and the first internal gear 34 shown in FIG. 6.

Figure 7:
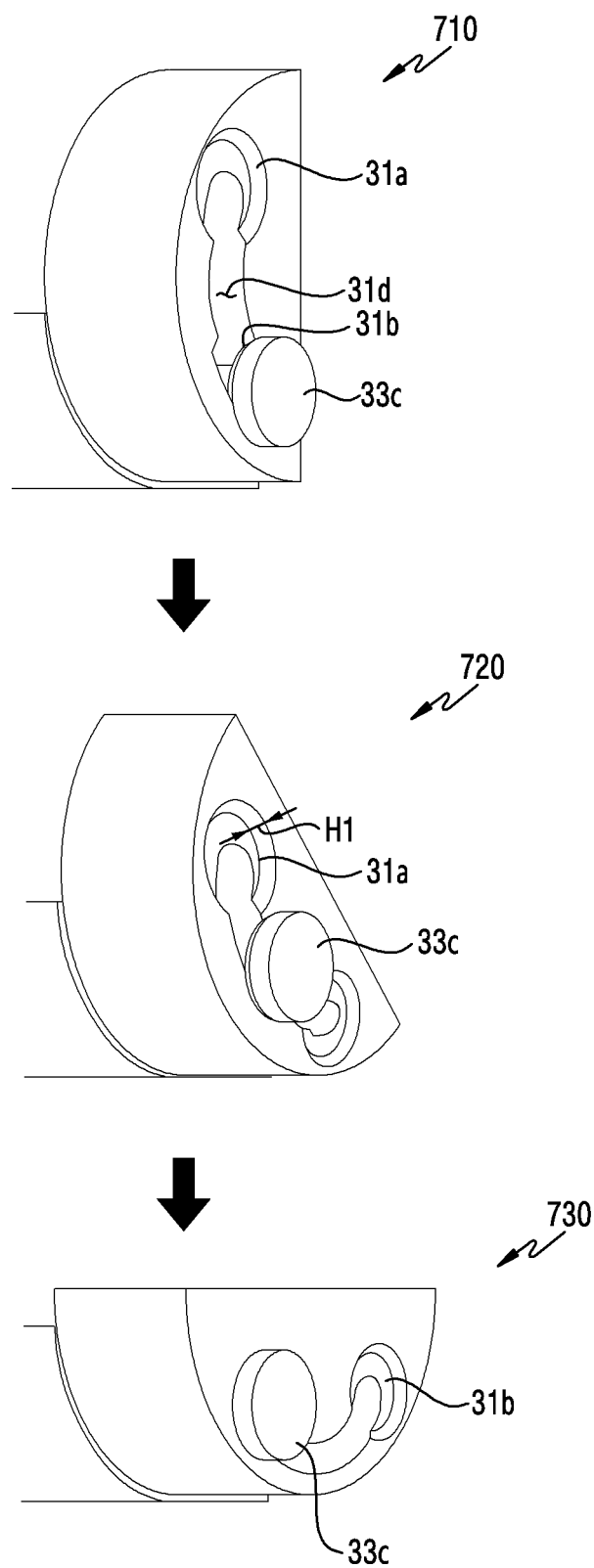
FIG. 7 is a view showing a cam structure of the main hinge according to an embodiment.

FIG. 7 is a view showing a cam structure of the main hinge according to an embodiment.

Referring to FIG. 7, the main hinge 331 according to an embodiment can fix the first housing structure 510 or the second housing structure 520 in specific states (e.g., the folded state or the unfolded state) using a cam structure. For example, when a portion of the first housing cam 33c is inserted in the first folding cam 31b, as indicated by reference numeral 710, the electronic device can be fixed in the folded state by the coupling force between the first housing cam 33c and the first folding cam 31b.

When a force applied by the user when the first housing cam 33c is inserted in the first folding cam 31b, and the force is larger than the coupling force between the first housing cam 33c and the first folding cam 31b, as indicated by reference numeral 720, the first housing cam 33c is separated out of the first folding cam 31b and can be moved (rotated) along a guide 31d. In this case, the user can separate the first housing cam 33c out of the first folding cam 31b with a relatively small force because the portion 3a of the side of the first housing cam 33c has a slope with a predetermined angle.

When the first housing cam 33c is positioned between the first unfolding cam 31a and the first folding cam 31b, as indicated by reference numeral 720 in FIG. 7, the first housing structure 510 and the second housing structure 520 can be fixed at a specific angle by the reacting force of the first elastic member 33f and the friction force between the first housing cam 33c and the guide 31d. However, the fixing by the reacting force and the friction force may be altered by a small external force.

When the first housing cam 33c is moved to the first unfolding cam 31a, as indicated by reference numeral 730, the first housing cam 33c is inserted into the first unfolding cam 31a by the reacting force of the first elastic member 33f, whereby the electronic device can be fixed in the unfolded state.

FIG. 7 shows only the operation of the first unfolding cam 31a, the first folding cam 31b, and the first housing cam 33c, but the second unfolding cam 41a, the second folding cam 41b, and the second housing cam 43c can operate similarly to the first unfolding cam 31a, the first folding cam 31b, and the first housing cam 33c shown in FIG. 7.

Figure 8:
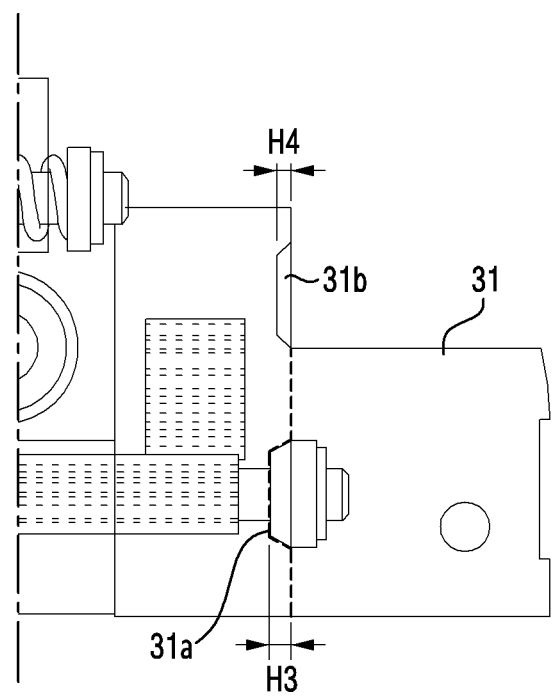
FIG. 8 is a view showing a cam structure of a main hinge according to another embodiment.

FIG. 8 is a view showing a cam structure of a main hinge according to another embodiment.

Referring to FIG. 8, in a cam structure of a main hinge according to another embodiment, the first unfolding cam 31a and the first folding cam 31b may be different in depth. For example, the first unfolding cam 31a may have a first depth H3 and the first folding cam 31b may have a second depth H4 smaller than the first depth H3. As described, in an embodiment, it is possible to apply different forces for exiting the unfolded state or the folded state by applying different depth to the first unfolding cam 31a and the first folding cam 31b. For example, since the second depth H4 is smaller than the first depth H3, a smaller force may be required to a user when changing the folded state to the unfolded state than when changing from the unfolded state to the folded state.

According to an embodiment, the depth of the first unfolding cam 31a may be smaller than the depth of the first folding cam 31b. According to another embodiment, it is possible to apply different coupling forces by applying different shapes to the first unfolding cam 31a and the first folding cam 31b. For example, it is possible to make the slopes of the sides of the first unfolding cam 31a and the first folding cam 31b different. Alternatively, it is possible to make the degree of insertion of the first housing cam 33c different by making the sizes of the grooves of the first unfolding cam 31a and the first folding cam 31b different.

For purposes of illustration, the first unfolding cam 31a and the first folding cam 31b were shown in FIG. 8. However, the above description can also be applied to the second unfolding cam 41a and the second folding cam 41b.

Figure 9A:
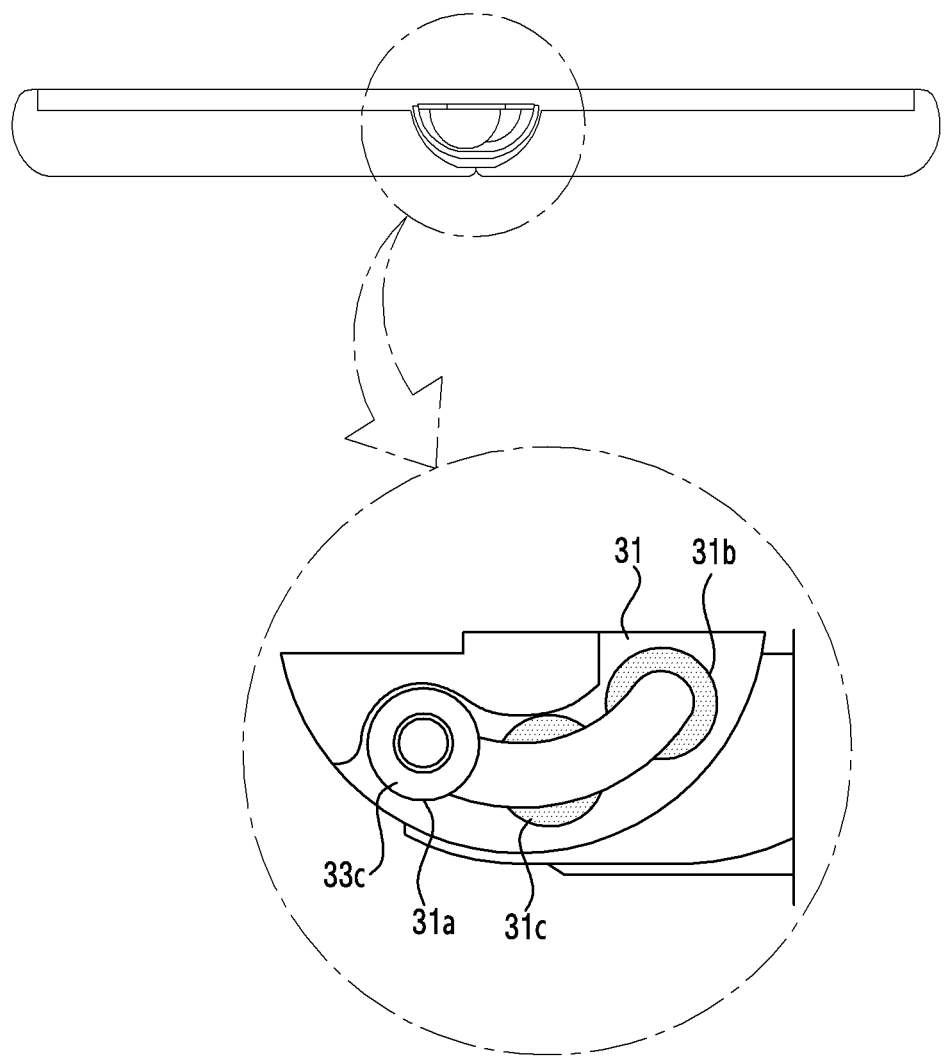
FIG. 9A is a view showing a cam structure of a main hinge according to another embodiment.
Figure 9B:
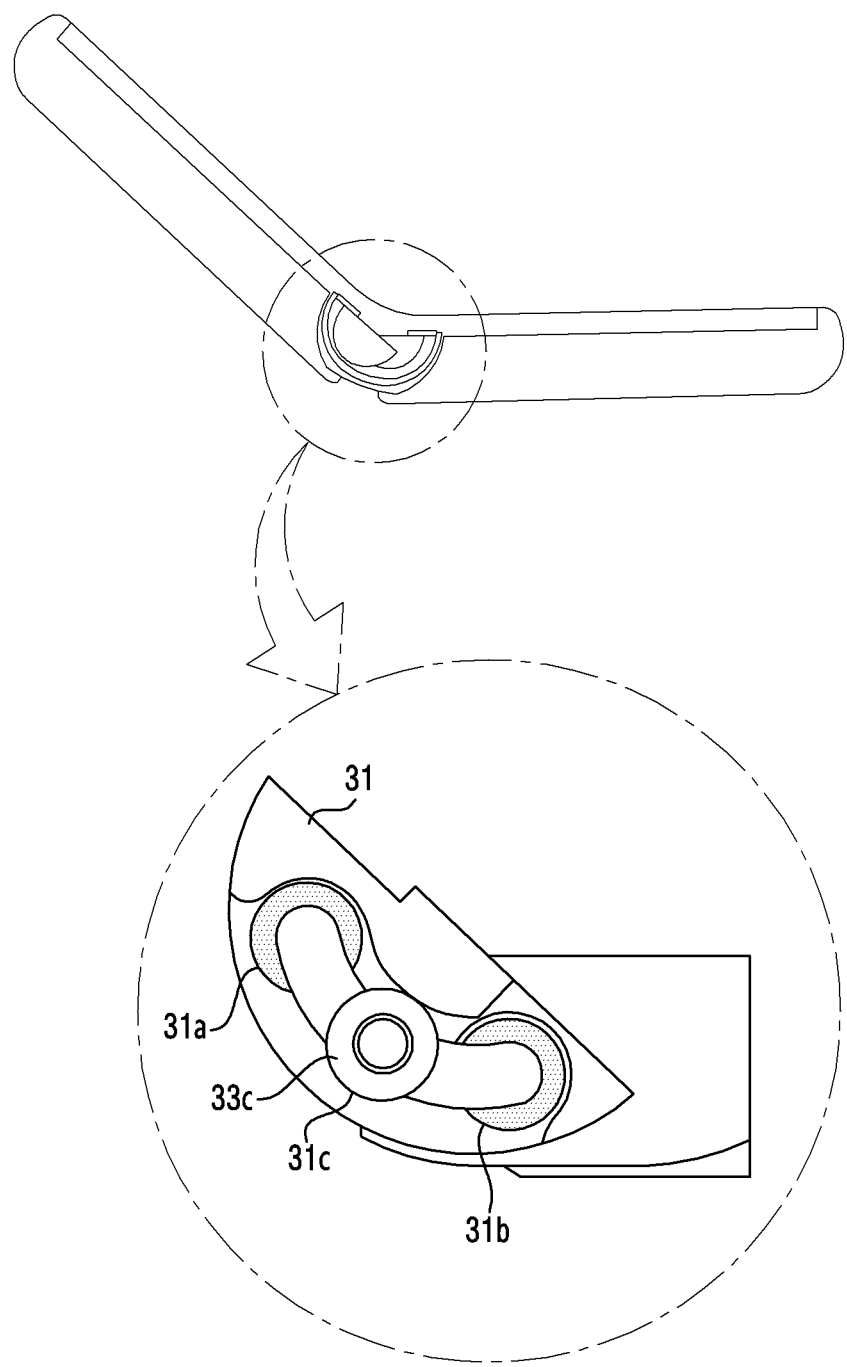
FIG. 9B is another view showing the cam structure of the main hinge according to another embodiment.
Figure 9C:
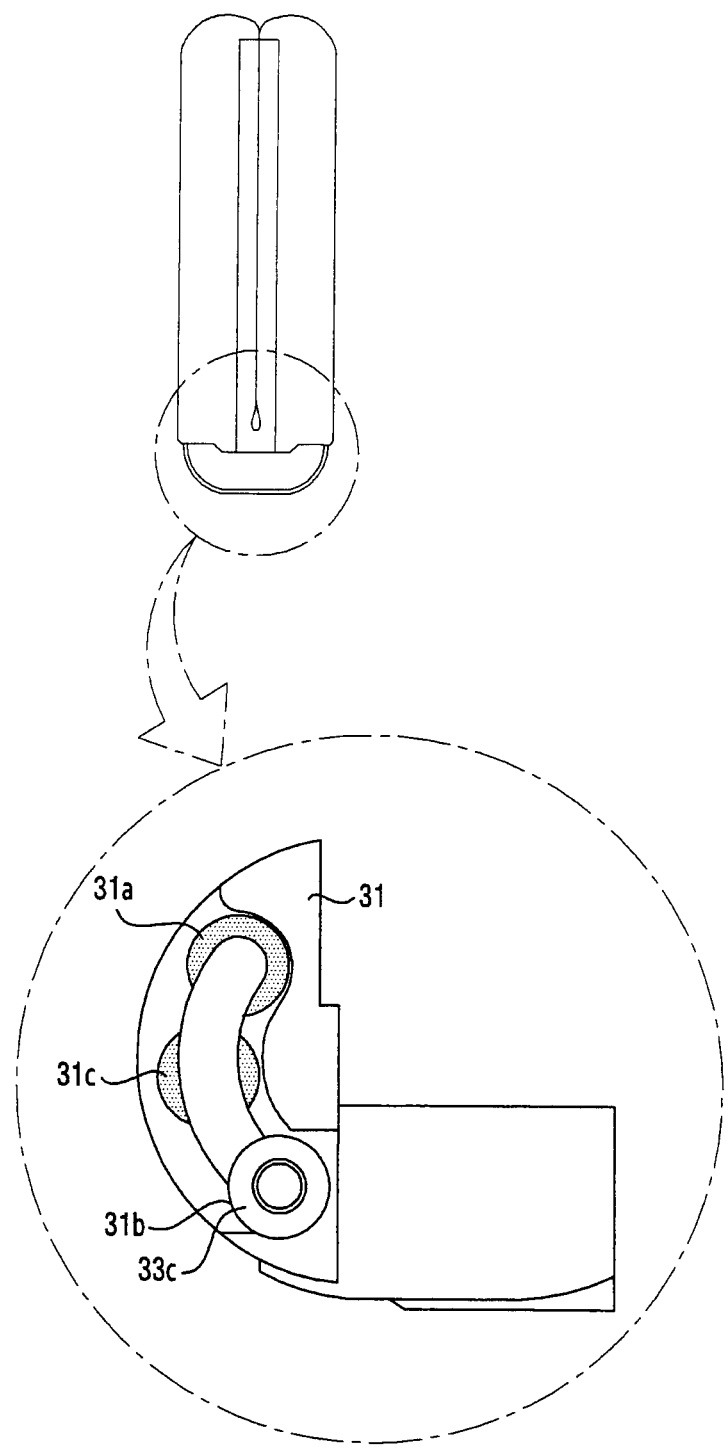
FIG. 9C is yet another view showing the cam structure of the main hinge according to another embodiment.

FIG. 9A is a view showing a cam structure of a main hinge according to another embodiment, FIG. 9B is another view showing the cam structure of the main hinge according to another embodiment, and FIG. 9C is yet another view showing the cam structure of the main hinge according to another embodiment.

Referring to FIGS. 9A to 9C, a main hinge according to another embodiment may further have a first intermediate folding cam 31c on the first bracket housing 31. The first intermediate folding cam 31c can fix the electronic device in the intermediate state (e.g., at a specific angle between a predetermined range such as 90 degrees and 120 degrees). The electronic device including the main hinge, as shown in FIG. 9A, can be fixed in the unfolded state when the first housing cam 33c is coupled to the first unfolding cam 31a. The electronic device, as shown in FIG. 9B, can be fixed in the intermediate state when the first housing cam 33c is coupled to the first intermediate folding cam 31c. The electronic device, as shown in FIG. 9C, can be fixed in the folded state when the first housing cam 33c is coupled to the first folding cam 31b.

The first intermediate folding cam 31c according to an embodiment may be the same or different in size as or from the first unfolding cam 31a and the first folding cam 31b. For example, when the first bracket housing 31 does not have three cams having the same size, the first intermediate folding cam 31c may be formed to be smaller than the first unfolding cam 31a and the first folding cam 31b.

According to an embodiment, the first intermediate folding cam 31c may have a different shape from the first unfolding cam 31a and the first folding cam 31b. As described above, in an embodiment, it is possible to make the coupling force in the unfolded state and the folded state and the coupling force in the intermediate state different.

For the convenience of description, although FIGS. 9A to 9C show only the first intermediate folding cam 31c, the second bracket housing 41 of the main hinge may further have a second intermediate folding cam corresponding to the first intermediate folding cam 31c.

According to an embodiment, the main hinge may have several first intermediate folding cams and second intermediate folding cams. For example, the main hinge may have three first intermediate folding cams and second intermediate folding cams. The three first intermediate folding cams and second intermediate folding cams may include a quarter folding cam, a two-quarter folding cam, and a three-quarter folding cam.

Various embodiments were described illustrating an in-folding type device in the specification. However, these embodiments may be also applied to an out-folding type device. In an in-folding type device, the display is disposed within the interior of the device when folded. In an out-folding type device, the display is exposed on the exterior when folded.

An electronic device including one hinge structure was described in the specification. However, according to an embodiment, the electronic device may include several hinge structures. The electronic device including several hinge structures may include only an in-folding type hinge structure, may include an out-folding type hinge structure, or may include both of an in-folding type hinge structure and an out-folding type hinge structure.

According to an embodiment of the disclosure, an electronic device (e.g., the electronic device 10) may comprise: a display (e.g., the display 100); a foldable housing (e.g., the foldable housing 500) including a first housing structure (e.g., the first housing structure 510) and a second housing structure (e.g., the second housing structure 520); and a hinge structure (e.g., the hinge structure 330) disposed between the first housing structure and the second housing structure, wherein the hinge structure includes: a first structure configured to enable the first housing structure to rotate about a first folding axis (e.g., the first folding axis A1) and the second housing structure to rotate about a second folding axis (e.g., the second folding axis A2); and a second structure configured to fix the first housing structure and the second housing structure in an unfolded state or a folded state.

According to an embodiment, the first structure may include: a first fixing bracket (e.g., the first bracket 310) and a second fixing bracket (e.g., the second bracket 320) configured to fix the hinge structure; a first bracket housing (e.g., the first bracket housing 31) rotatably connected to the first fixing bracket; a second bracket housing (e.g., the second bracket housing 41) rotatably connected to the second fixing bracket and disposed opposite to the first bracket housing; a first folding shaft (e.g., the first folding shaft 33) disposed on the first folding axis, and disposed through the first fixing bracket and the first bracket housing; a second folding shaft (e.g., the second folding shaft 43) disposed on the second folding axis, and disposed through the second fixing bracket and the second bracket housing; a first internal gear (e.g., the first internal gear 34) disposed in the first bracket housing; a second internal gear (e.g., the second internal gear 44) disposed in the second bracket housing; a first main gear (e.g., the first main gear 33a) coupled to a portion of the first folding shaft and engaged with the first internal gear on an end of the first main gear; a second main gear (e.g., the second main gear 43a) coupled to a portion of the second folding shaft and engaged with the second internal gear on an end of the second main gear; a first gear (e.g., the first gear 35) engaged with the first main gear on an opposite end of the first main gear; and a second gear (e.g., the second gear 45) engaged with of the first gear and the second main gear on an opposite end of the second main gear.

According to an embodiment, the second structure may include: a first housing cam (e.g., the first housing cam 33c) coupled to an end portion of the first folding shaft; a second housing cam (e.g., the second housing cam 43c) coupled to an end portion of the second folding shaft; a first housing ring (e.g., the first housing ring 33b) configured to prevent separation of the first housing cam; a second housing ring (e.g., the second housing ring 43b) configured to prevent separation of the second housing cam; a first elastic member (e.g., the first elastic member 33f) compressed and coupled to an opposite end portion of the first folding shaft and configured to provide a first reacting force; a second elastic member (e.g., the second elastic member 43f) compressed and coupled to an opposite end portion of the second folding shaft and configured to provide a second reacting force; a first gear ring (e.g., the first gear ring 33d, 33e) configured to prevent separation of the first elastic member; a second gear ring (e.g., the second gear ring 43d, 43e) configured to prevent separation of the second elastic member; a first folding cam (e.g., the first folding cam 31b) formed on a side of the first bracket housing and configured to receive the first housing cam in the folded state; a second folding cam (e.g., the second folding cam 41b) formed on a side of the second bracket housing and configured to receive the second housing cam in the folded state; a first unfolding cam (e.g., the first unfolding cam 31a) formed on the side of the first bracket housing and configured to receive the first housing cam in the unfolded state; and a second unfolding cam (e.g., the second unfolding cam 41a) formed on the side of the second bracket housing and configured to receive the second housing cam in the unfolded state.

According to an embodiment, the first folding cam and the first unfolding cam may have groove shapes corresponding to the first housing cam. The second folding cam and the second unfolding cam may have groove shapes corresponding to the second housing cam.

According to an embodiment, a coupling force between the first housing cam and the first folding cam may be different from a coupling force between the first housing cam and the first unfolding cam, and a coupling force between the second housing cam and the second folding cam may be different from a coupling force between the second housing cam and the second unfolding cam.

According to an embodiment, the first folding cam and the first unfolding cam may be different in size, shape, depth, and/or inclination angle of one or more sides, and the second folding cam and the second unfolding cam may be different in size, shape, depth, and/or inclination angle of one or more sides.

According to an embodiment, the electronic device may further comprise: at least one first intermediate folding cam (e.g., the first intermediate folding cam 31c) formed on the side of the first bracket housing and configured to receive the first housing cam in an intermediate state, thereby fixing the first housing structure and the second housing structure at at least one designated angle; and at least one second intermediate folding cam formed on the side of the second bracket housing and configured to receive the second housing cam in the intermediate state, thereby fixing the first housing structure and the second housing structure at the at least one designated angle.

According to an embodiment, the at least one first intermediate folding cam may be different in size and/or depth from the first folding cam and the first unfolding cam, and the at least one second intermediate folding cam may be different in size and/or depth from the second folding cam and the second unfolding cam.

According to an embodiment, the hinge structure may further include a first side hinge (e.g., the first side hinge 332a) and a second side hinge (e.g., the second side hinge 332b) disposed at both ends of the hinge structure and configured to prevent shaking at both end portions of the first housing structure and the second housing structure.

According to an embodiment, the first structure may be rotated in an in-folding type or an out-folding type.

According to an embodiment, the display may further include an electro magnetic resonance type touch panel configured to receive input from an electronic pen.

According to an embodiment of the disclosure, a hinge structure (e.g., the hinge structure 330) included in a foldable electronic device (e.g., the electronic device 10) may comprise: a gear structure configured to enable a first housing structure (e.g., the first housing structure 510) connected to a side of the hinge structure to rotate about a first folding axis (e.g., the first folding axis A1) and a second housing structure (e.g., the second housing structure 520) connected to another side of the hinge structure to rotate about a second folding axis (e.g., the second folding axis A2); and a cam structure configured to fix the first housing structure and the second housing structure in an unfolded state or a folded state.

According to an embodiment, the gear structure may include: a first fixing bracket (e.g., the first bracket 310) and a second fixing bracket (e.g., the second bracket 320) configured to fix the hinge structure; a first bracket housing (e.g., the first bracket housing 31) rotatably connected to the first fixing bracket; a second bracket housing (e.g., the second bracket housing 41) rotatably connected to the second fixing bracket and disposed opposite to the first bracket housing; a first folding shaft (e.g., the first folding shaft 33) disposed on the first folding axis, and disposed through the first fixing bracket and the first bracket housing; a second folding shaft (e.g., the second folding shaft 43) disposed on the second folding axis, and disposed through the second fixing bracket and the second bracket housing; a first internal gear (e.g., the first internal gear 34) disposed in the first bracket housing; a second internal gear (e.g., the second internal gear 44) disposed in the second bracket housing; a first main gear (e.g., the first main gear 33a) coupled to a portion of the first folding shaft and engaged with the first internal gear on an end of the first main gear; a second main gear (e.g., the second main gear 43a) coupled to a portion of the second folding shaft and engaged with the second internal gear on an end of the second main gear; a first gear (e.g., the first gear 35) engaged with the first main gear on an opposite end of the first main gear; and a second gear (e.g., the second gear 45) engaged with the first gear and the second main gear on an opposite end of the second main gear.

According to an embodiment, the cam structure may include: a first housing cam (e.g., the first housing cam 33c) coupled to an end portion of the first folding shaft; a second housing cam (e.g., the second housing cam 43c) coupled to an end portion of the second folding shaft; a first housing ring (e.g., the first housing ring 33b) configured to prevent separation of the first housing cam; a second housing ring (e.g., the second housing ring 43b) configured to prevent separation of the second housing cam; a first elastic member (e.g., the first elastic member 33f) compressed and coupled to an opposite end portion of the first folding shaft and configured to provide a first reacting force; a second elastic member (e.g., the second elastic member 43f) compressed and coupled to an opposite end portion of the second folding shaft and configured to provide a second reacting force; a first gear ring (e.g., the first gear ring 33d, 33e) configured to prevent separation of the first elastic member; a second gear ring (e.g., the second gear ring 43d, 43e) configured to prevent separation of the second elastic member; a first folding cam (e.g., the first folding cam 31b) formed on a side of the first bracket housing and configured to receive the first housing cam in the folded state; a second folding cam (e.g., the second folding cam 41b) formed on a side of the second bracket housing and configured to receive the second housing cam in the folded state; a first unfolding cam (e.g., the first unfolding cam 31a) formed on the side of the first bracket housing and configured to receive the first housing cam in the unfolded state; and a second unfolding cam (e.g., the second unfolding cam 41a) formed on the side of the second bracket housing and configured to receive the second housing cam in the unfolded state.

According to an embodiment, the first folding cam and the first unfolding cam may have groove shapes corresponding to the first housing cam, and the second folding cam and the second unfolding cam may have groove shapes corresponding to the second housing cam.

According to an embodiment, sizes, shapes, depths, and/or inclination angles of one or more sides of the first folding cam and the first unfolding cam may be different such that a coupling force between the first housing cam and the first folding cam and a coupling force between the first housing cam and the first unfolding cam are different; and sizes, shapes, depths, and/or inclination angles of one or more sides of the second folding cam and the second unfolding cam may be different such that a coupling force between the second housing cam and the second folding cam and a coupling force between the second housing cam and the second unfolding cam are different.

According to an embodiment, the cam structure may include: at least one first intermediate folding cam (e.g., the first intermediate folding cam 31c) formed on the side of the first bracket housing and configured to receive the first housing cam in an intermediate state, thereby fixing the first housing structure and the second housing structure at at least one designated angle; and at least one second intermediate folding cam formed on the side of the second bracket housing and configured to receive the second housing cam in the intermediate state, thereby fixing the first housing structure and the second housing structure at the at least one designated angle.

According to an embodiment, the at least one first intermediate folding cam may be different in size and/or depth from the first folding cam and the first unfolding cam, and the at least one second intermediate folding cam may be different in size and/or depth from the second folding cam and the second unfolding cam.

According to an embodiment, the hinge structure may further comprise: a first side hinge (e.g., the first side hinge 332a) and a second side hinge (e.g., the second side hinge 332b) disposed at both ends of the hinge structure and configured to prevent shaking at both end portions of the first housing structure and the second housing structure.

According to an embodiment, the hinge structure may be rotated in an in-folding type or an out-folding type.

In the electronic device according to certain embodiments, the foldable housing can be maintained (fixed without shaking) in specific states, so reliability of the device can be improved. Since the electronic device according to certain embodiments does not include magnets, it is possible to prevent malfunction or error in various electro magnetic resonance type components of the device (e.g., an electronic pen). The effects of the disclosure are not limited to the effects described above and other effects can be clearly understood by those skilled in the art from the following description.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., a program) including one or more instructions that are stored in a storage medium (e.g., a memory) that is readable by a machine (e.g., the electronic device 10). For example, a processor of the machine (e.g., the electronic device 10) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the present disclosure has been shown and described with reference to various embodiments thereof, it will be understood by those skilled in the art that various changes in form and details may be made therein without departing from the present disclosure as defined by the appended claims and their equivalents.

What is claimed is:

1. An electronic device comprising:
    a display;
    a foldable housing including a first housing structure and a second housing structure; and
    a hinge structure disposed between the first housing structure and the second housing structure,
    wherein the hinge structure includes:
        a first structure configured to enable the first housing structure to rotate about a first folding axis and the second housing structure to rotate about a second folding axis, wherein the first structure comprises:
        a fixing bracket configured to fix the hinge structure;
        a bracket housing rotatably connected to the fixing bracket;
        a folding shaft disposed on the folding axis and rotatably connected through the fixing bracket and the bracket housing; and
        a gear structure disposed on the folding shaft and configured to enable the foldable housing to rotate about the folding axis; and
    a second structure configured to fix the first housing structure and the second housing structure in an unfolded state or a folded state, wherein the second structure comprises:
        a cam structure coupled to an end portion of the folding shaft;
        an elastic member coupled to an opposite end portion of the folding shaft and configured to provide a reacting force; and
        a recess formed in the bracket housing and configured to receive the cam structure in the folded state or in the unfolded state.

2. The electronic device of claim 1,
    wherein the fixing bracket comprises
    a first fixing bracket and a second fixing bracket configured to fix the hinge structure;
    wherein the bracket housing comprises a first bracket housing rotatably connected to the first fixing bracket and
    a second bracket housing rotatably connected to the second fixing bracket and disposed opposite to the first bracket housing,
    wherein the folding shaft comprises a first folding shaft disposed on the first folding axis, and disposed through the first fixing bracket and the first bracket housing and
    a second folding shaft disposed on the second folding axis, and disposed through the second fixing bracket and the second bracket housing, and
    wherein the gear structure comprises:
        a first internal gear disposed in the first bracket housing;
        a second internal gear disposed in the second bracket housing;

a first main gear coupled to a portion of the first folding shaft and engaged with the first internal gear on an end of the first main gear;

a second main gear coupled to a portion of the second folding shaft and engaged with the second internal gear on an end of the second main gear;

a first gear engaged with the first main gear on an opposite end of the first main gear; and a second gear engaged with the first gear and the second main gear on an opposite end of the second main gear.

3. The electronic device of claim 2, wherein the cam structure comprises:

a first housing cam coupled to an end portion of the first folding shaft;

a second housing cam coupled to an end portion of the second folding shaft;

a first housing ring configured to prevent separation of the first housing cam;

a second housing ring configured to prevent separation of the second housing cam;

wherein the elastic member comprises:

a first elastic member compressed and coupled to an opposite end portion of the first folding shaft and configured to provide a first reacting force;

a second elastic member compressed and coupled to an opposite end portion of the second folding shaft and configured to provide a second reacting force;

a first gear ring configured to prevent separation of the first elastic member; and a second gear ring configured to prevent separation of the second elastic member; and wherein the recess comprises:

a first folding cam formed on a side of the first bracket housing and configured to receive the first housing cam in the folded state;

a second folding cam formed on a side of the second bracket housing and configured to receive the second housing cam in the folded state;

a first unfolding cam formed on the side of the first bracket housing and configured to receive the first housing cam in the unfolded state; and a second unfolding cam formed on the side of the second bracket housing and configured to receive the second housing cam in the unfolded state.

4. The electronic device of claim 3, wherein the first folding cam and the first unfolding cam have groove shapes corresponding to the first housing cam, and the second folding cam and the second unfolding cam have groove shapes corresponding to the second housing cam.

5. The electronic device of claim 3, wherein a coupling force between the first housing cam and the first folding cam is different from a coupling force between the first housing cam and the first unfolding cam, and a coupling force between the second housing cam and the second folding cam is different from a coupling force between the second housing cam and the second unfolding cam.

6. The electronic device of claim 5, wherein the first folding cam and the first unfolding cam are different in size, shape, depth, and/or inclination angle of one or more sides, and the second folding cam and the second unfolding cam are different in size, shape, depth, and/or inclination angle of one or more sides.

7. The electronic device of claim 3, further comprising:

at least one first intermediate folding cam formed on the side of the first bracket housing and configured to receive the first housing cam in an intermediate state, thereby fixing the first housing structure and the second housing structure at least one designated angle; and at least one second intermediate folding cam formed on the side of the second bracket housing and configured to receive the second housing cam in the intermediate state, thereby fixing the first housing structure and the second housing structure at the at least one designated angle.

8. The electronic device of claim 7, wherein the at least one first intermediate folding cam is different in size and/or depth from the first folding cam and the first unfolding cam, and the at least one second intermediate folding cam is different in size and/or depth from the second folding cam and the second unfolding cam.

9. The electronic device of claim 1, wherein the hinge structure further comprises a first side hinge and a second side hinge disposed at both ends of the hinge structure and configured to prevent shaking at both end portions of the first housing structure and the second housing structure.

10. The electronic device of claim 1, wherein the first structure is rotated in an in-folding type or an out-folding type.

11. The electronic device of claim 1, wherein the display further comprises an electro-magnetic resonance type touch panel configured to receive input from an electronic pen.

12. A hinge structure included in a foldable electronic device, the hinge structure comprising:

a gear structure disposed on a folding shaft and configured to enable a first housing structure connected to a side of the hinge structure to rotate about the first folding axis and a second housing structure connected to another side of the hinge structure to rotate about the second folding axis; and a cam structure configured to fix the first housing structure and the second housing structure in an unfolded state or a folded state wherein the cam structure comprises:

a housing cam coupled to an end portion of the folding shaft;

an elastic member coupled to an opposite end portion of the folding shaft and configured to provide a reacting force; and a recess formed in a bracket housing and configured to receive the housing cam in the folded state or in the unfolded state.

13. The hinge structure of claim 12, wherein the gear hinge structure further comprises:

a first fixing bracket and a second fixing bracket configured to fix the hinge structure;

a first bracket housing rotatably connected to the first fixing bracket;

a second bracket housing rotatably connected to the second fixing bracket and disposed opposite to the first bracket housing;

the first folding shaft disposed on the first folding axis, and disposed through the first fixing bracket and the first bracket housing; and the second folding shaft disposed on the second folding axis, and disposed through the second fixing bracket and the second bracket housing; and wherein the gear structure comprises;

a first internal gear disposed in the first bracket housing;

a second internal gear disposed in the second bracket housing;

a first main gear coupled to a portion of the first folding shaft and engaged with the first internal gear on an end of the first main gear;

a second main gear coupled to a portion of the second folding shaft and engaged with the second internal gear on an end of the second main gear;

a first gear engaged with the first main gear on an opposite end of the first main gear; and a second gear engaged with of the first gear and the second main gear on an opposite end of the second main gear.

14. The hinge structure of claim 13, wherein the housing cam further comprises:

a first housing cam coupled to an end portion of the first folding shaft;

a second housing cam coupled to an end portion of the second folding shaft;

a first housing ring configured to prevent separation of the first housing cam; and a second housing ring configured to prevent separation of the second housing cam;

wherein the elastic member comprises:

a first elastic member compressed and coupled to an opposite end portion of the first folding shaft and configured to provide a first reacting force;

a second elastic member compressed and coupled to an opposite end portion of the second folding shaft and configured to provide a second reacting force;

a first gear ring configured to prevent separation of the first elastic member;

a second gear ring configured to prevent separation of the second elastic member;

wherein the recess comprises:

a first folding cam formed on a side of the first bracket housing and configured to receive the first housing cam in the folded state;

a second folding cam formed on a side of the second bracket housing and configured to receive the second housing cam in the folded state;

a first unfolding cam formed on the side of the first bracket housing and configured to receive the first housing cam in the unfolded state; and a second unfolding cam formed on the side of the second bracket housing and configured to receive the second housing cam in the unfolded state.

15. The hinge structure of claim 14, wherein the first folding cam and the first unfolding cam have groove shapes corresponding to the first housing cam, and the second folding cam and the second unfolding cam have groove shapes corresponding to the second housing cam.

16. The hinge structure of claim 14, wherein sizes, shapes, depths, and/or inclination angles of one or more sides of the first folding cam and the first unfolding cam are different such that a coupling force between the first housing cam and the first folding cam and a coupling force between the first housing cam and the first unfolding cam are different; and sizes, shapes, depths, and/or inclination angles of one or more sides of the second folding cam and the second unfolding cam are different such that a coupling force between the second housing cam and the second folding cam and a coupling force between the second housing cam and the second unfolding cam are different.

17. The hinge structure of claim 14, wherein the cam structure further comprises:

at least one first intermediate folding cam formed on the side of the first bracket housing and configured to receive the first housing cam in an intermediate state, thereby fixing the first housing structure and the second housing structure at least one designated angle; and at least one second intermediate folding cam formed on the side of the second bracket housing and configured to receive the second housing cam in the intermediate state, thereby fixing the first housing structure and the second housing structure at the at least one designated angle.

18. The hinge structure of claim 17, wherein the at least one first intermediate folding cam is different in size and/or depth from the first folding cam and the first unfolding cam, and the at least one second intermediate folding cam is different in size and/or depth from the second folding cam and the second unfolding cam.

19. The hinge structure of claim 12, further comprising:

a first side hinge and a second side hinge disposed at both ends of the hinge structure and configured to prevent shaking at both end portions of the first housing structure and the second housing structure.

20. The hinge structure of claim 12, wherein the hinge structure is rotated in an in-folding type or an out-folding type.

* * * * *